United States Patent
Maeda

(10) Patent No.: US 9,659,649 B2
(45) Date of Patent: May 23, 2017

(54) SEMICONDUCTOR STORAGE DEVICE AND DRIVING METHOD THEREOF

(71) Applicant: KABUSHIKI KAISHA TOSHIBA, Minato-ku (JP)

(72) Inventor: Takashi Maeda, Kamakura (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/057,318

(22) Filed: Mar. 1, 2016

(65) Prior Publication Data
US 2017/0069379 A1    Mar. 9, 2017

Related U.S. Application Data

(60) Provisional application No. 62/215,554, filed on Sep. 8, 2015.

(51) Int. Cl.
G11C 13/00    (2006.01)

(52) U.S. Cl.
CPC ...... *G11C 13/0069* (2013.01); *G11C 13/0038* (2013.01); *G11C 13/0064* (2013.01); *G11C 13/0002* (2013.01); *G11C 2013/0066* (2013.01)

(58) Field of Classification Search
CPC .................................................. G11C 13/0002
USPC ........................................................ 365/148
See application file for complete search history.

(56) References Cited

U.S. PATENT DOCUMENTS

| 7,529,124 | B2 * | 5/2009 | Cho | G11C 8/10 365/158 |
| 7,599,219 | B2 * | 10/2009 | Kim | G11C 16/12 365/185.19 |
| 7,656,710 | B1 * | 2/2010 | Wong | G11C 11/5628 365/185.18 |
| 8,339,833 | B2 | 12/2012 | Tokiwa et al. | |
| 9,208,887 | B2 * | 12/2015 | Kondo | G11C 16/10 |
| 2012/0198297 | A1 * | 8/2012 | Kamigaichi | G11C 11/5628 714/746 |

(Continued)

FOREIGN PATENT DOCUMENTS

| JP | 2008-243263 | 10/2008 |
| JP | 4157582 | 10/2008 |

(Continued)

*Primary Examiner* — Son Mai
(74) *Attorney, Agent, or Firm* — Oblon, McClelland, Maier & Neustadt, L.L.P.

(57) ABSTRACT

A memory includes first signal-lines, second signal-lines and resistance-change memory cells. First and second drivers can supply power to the first and second signal-lines, respectively. The second driver increases a voltage of a selected second signal-line in a write-loop higher than that in a previous write-loop. The write-loop includes a write operation and a verify operation. A voltage increase width of the selected second signal-line at a time of transition from a first write-loop to a second write-loop is larger than a voltage increase width of the selected second signal-line at a time of transition from the second write-loop to a third write-loop. A voltage increase width of the selected second signal-line at a time of transition from the second write-loop to the third write-loop is smaller than a voltage increase width of the selected second signal-line at a time of transition from the third write-loop to a forth write-loop.

17 Claims, 9 Drawing Sheets

(56) References Cited

U.S. PATENT DOCUMENTS

| | | | |
|---|---|---|---|
| 2013/0148430 A1* | 6/2013 | Shiino | G11C 16/10 365/185.18 |
| 2013/0258773 A1* | 10/2013 | Honma | G11C 16/10 365/185.03 |
| 2014/0070161 A1 | 3/2014 | Sugimae et al. | |
| 2014/0233299 A1* | 8/2014 | Lan | G11C 13/0064 365/148 |
| 2015/0078064 A1 | 3/2015 | Tanaka et al. | |
| 2015/0380094 A1* | 12/2015 | Nagashima | G11C 16/10 365/185.19 |

FOREIGN PATENT DOCUMENTS

| | | |
|---|---|---|
| JP | 2010-225228 | 10/2010 |
| JP | 5039079 | 10/2012 |
| JP | 2014-53522 | 3/2014 |
| JP | 2015-60608 | 3/2015 |
| WO | WO 2008/120579 A1 | 10/2008 |

* cited by examiner

SEMICONDUCTOR STORAGE DEVICE AND DRIVING METHOD THEREOF

CROSS REFERENCE TO RELATED APPLICATIONS

This application is based upon and claims the benefit of priority from the prior U.S. Provisional Patent Application No. 62/215,554, filed on Sep. 8, 2015, the entire contents of which are incorporated herein by reference.

FIELD

The embodiments of the present invention relate to a semiconductor storage device and driving method thereof.

BACKGROUND

A resistance-change memory such as a ReRAM stores data in memory cells by bringing the memory cells to a high-resistance state or a low-resistance state. For example, when a SET voltage is applied to a bit line while keeping a word line at a low-level voltage Vss, a relevant memory cell is changed from a high-resistance state (a RESET state) to a low-resistance state (a SET state).

However, a large cell current flows in a memory cell when the memory cell becomes a low-resistance state and thus, when a SET state is to be simultaneously written to a large number of memory cells, the peak (the maximum value) of a consumption current is increased. Furthermore, when a SET state is to be written to a plurality of memory cells connected to a selected word line, a large current flows in some memory cells that have been previously brought to a SET state from corresponding bit lines to the word line and accordingly the potential of the word line is raised. In this case, a voltage applied to other memory cells to which a SET state is not yet written is lowered and thus write of data thereto becomes difficult. Therefore, it is desirable to suppress the peak (the maximum value) of a current flowing in memory cells to a low level when data is to be written to the memory cells.

DETAILED DESCRIPTION

Embodiments will now be explained with reference to the accompanying drawings. The present invention is not limited to the embodiments.

A semiconductor storage device according to an embodiment includes a plurality of first signal lines and a plurality of second signal lines. A plurality of resistance-change memory cells are located between the first signal lines and the second signal lines, respectively. A first driver is capable of supplying power to the first signal lines. A second driver is capable of supplying power to the second signal lines. The second driver increases a voltage of selected one of the second signal lines in a write loop higher than that of the selected second signal line in a previous write loop. The write loop includes a write operation of writing data to the memory cells and a verify operation of verifying that data has been written thereto. A voltage increase width of the selected second signal line at a time of transition in a plurality of the write loops from a first write loop to a second write loop following the first write loop is larger than a voltage increase width of the selected second signal line at a time of transition from the second write loop to a third write loop following the second write loop. A voltage increase width of the selected second signal line at a time of transition from the second write loop to the third write loop is smaller than a voltage increase width of the selected second signal line at a time of transition from the third write loop to a fourth write loop following the third write loop.

The following embodiments can be applied to a resistance-change memory. The embodiments can be applied, for example, to a ReRAM (Resistance Random Access Memory), a PRAM (Phase-change RAM), a PCM (Phase-Change Memory), an iPCM (interfacial PCM), a FeNAND (Ferroelectric NAND-type memory), and an MRAM (Magnetic Random Access Memory).

First Embodiment

Figure 1:
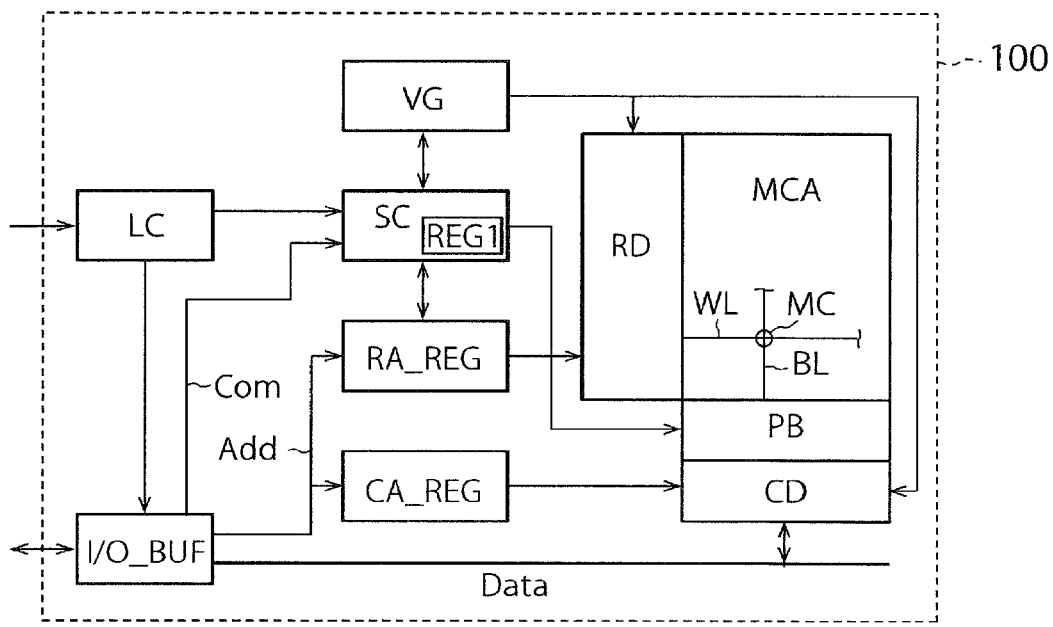
FIG. 1 is a block diagram showing an example of a configuration of a memory 100 according to a first embodiment.

FIG. 1 is a block diagram showing an example of a configuration of a memory 100 according to a first embodiment. The memory 100 includes a memory cell array MCA, a page buffer PB, a column decoder CD, a row decoder RD, an internal-voltage generation circuit VG, a sequence controller SC, a logic controller LC, a row address register RA_REG, a column address register CA_REG, and an input/output buffer (hereinafter, "I/O buffer") I/O_BUF.

The internal-voltage generation circuit VG includes a step-up circuit that generates a potential higher than that of an external power supply using a charge pump circuit, a step-down circuit that generates an internal step-down potential from that of the external power supply, a BGR (Band-Gap-Reference) circuit that generates a constant potential regardless of temperatures and power supply voltages, a power-on detection circuit that detects rising of the potential of the external power supply to a value equal to or larger than a certain value, and the like. A potential generated by the internal-voltage generation circuit VG is supplied to the row decoder RD, the page buffer PB, the column decoder CD, the sequence controller SC, the row address register RA_REG, and the column address register CA_REG.

The memory cell array MCA includes a plurality of memory cells MC arrayed two-dimensionally or three-dimensionally. The memory cells MC are located to correspond to intersections between a plurality of word lines (first signal lines) WL and a plurality of bit lines (second signal lines) BL, respectively, and are connected between the word lines WL and the bit lines BL. Therefore, a current hardly flows between the bit lines BL and the word lines WL when the memory cells MC are in a RESET state (a high-resistance state), and a relatively-large current flows between the bit lines BL and the word lines WL when the memory cells MC are in a SET state (a low-resistance state).

The row decoder RD serving as a first driver can selectively supply power to any of the word lines WL of the memory cell array MCA according to a row address.

The column decoder CD and the page buffer PB serving as a second driver can supply power to selected bit lines BL according to a column address. The column decoder CD and the page buffer PB thereby read data in a memory cell MC and temporarily store therein the read data. The column decoder CD and the page buffer PB also temporarily store therein write data and write the write data to a memory cell MC via selected bit lines BL. The page buffer PB includes a sense amplifier circuit and a data retention circuit and performs read and write of data in units of pages of the memory cell array MCA. The column decoder CD transfers read data stored in the page buffer PB column by column to the I/O buffer I/O_BUF. The column decoder CD also transfers write data transferred from the I/O buffer I/O_BUF column by column to the page buffer PB.

The row address register RA_REG receives a row address signal via the I/O buffer I/O_BUF and retains the row address signal. The column address register CA_REG receives a column address signal via the I/O buffer I/O_BUF and retains the column address signal. The row address register RA_REG and the column address register CA_REG transfer the row address signal and column address signal (hereinafter, also "address signal") Add to the row decoder RD and the column decoder CD, respectively.

The logic controller LC controls input of the address signal Add and controls input/output of data Data (read data or write data) based on a command Com such as a chip enable signal, a command enable signal, an address-latch enable signal, a write enable signal, or a read enable signal. A read operation or a write operation is performed based on the command Com.

The sequence controller SC executes sequence control on read, write, or erase upon reception of the command Com. The sequence controller SC includes a register REG1 serving as a storage part. The register REG1 has SET voltages Vset to be applied to selected bit lines BL in a write sequence and/or step-up widths ΔVset of the SET voltages Vset stored in advance therein. The SET voltage Vset and the step-up width ΔVset will be explained later.

The internal-voltage generation circuit VG is controlled by the sequence controller SC and generates/supplies predetermined voltages necessary for various operations. The internal-voltage generation circuit VG generates the SET voltage Vset based on data of the SET voltage Vset and/or the step-up width ΔVset stored in the register REG1 of the sequence controller SC.

In the first embodiment, the memory 100 repeatedly performs a plurality of write loops while increasing the SET voltage Vset to be applied to selected bit lines BL by the step-up width ΔVset. The memory 100 thereby writes data to a plurality of memory cells MC (a page) connected to a selected word line WL. Each of the write loops includes a write operation of writing data to memory cells MC and a verify operation of verifying that data has been written thereto. That is, the memory 100 can transition the memory cells MC to a SET state partially or gradually in units of pages by repeating the write operation and the verity operation while stepping up the voltage of the selected bit lines BL.

The I/O buffer I/O_BUF outputs read data from the column decoder CD to outside or transfers write data from outside to the column decoder CD. The I/O buffer I/O_BUF also receives the command Com and the address signal Add.

A data write operation of the memory 100 according to the first embodiment is explained next.

Figure 2:
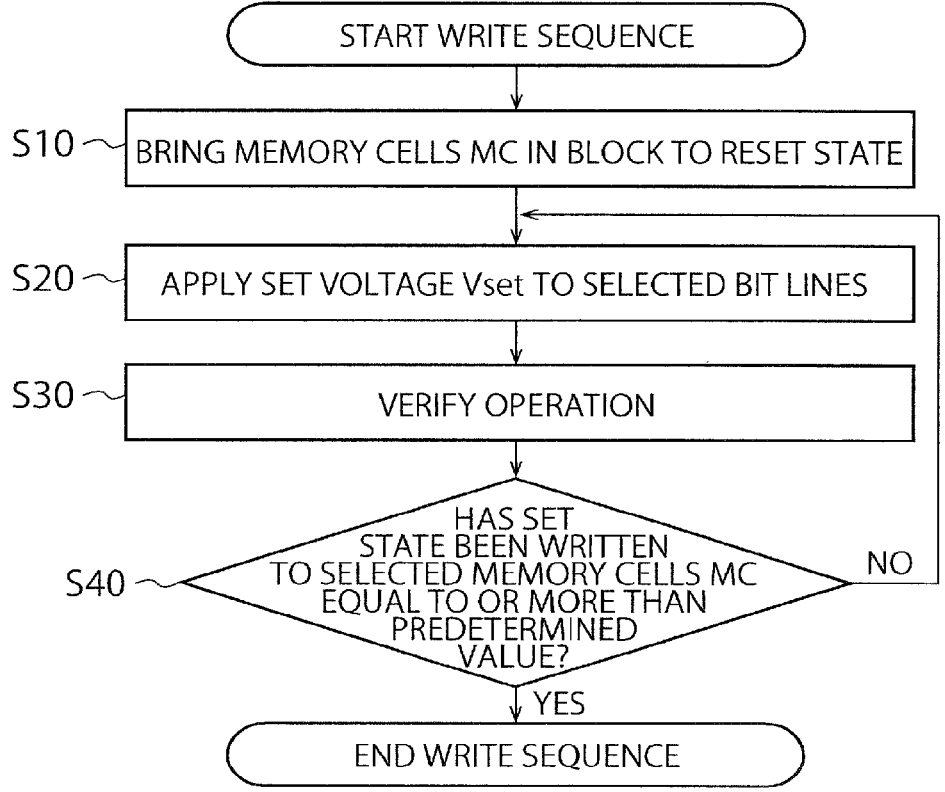
FIG. 2 is a flowchart showing an example of a write sequence according to the first embodiment.

FIG. 2 is a flowchart showing an example of a write sequence according to the first embodiment. In the data write operation, for example, all of the memory cells MC in the memory cell array MCA or a memory cell block are temporarily brought to an erased state (a RESET state (high-resistance state)) (S10) and then a SET state (a low-resistance state) is written to selected memory cells MC. Therefore, the data write operation in the first embodiment is an operation of writing a SET state. Designations "SET state" and "RESET state" are set for convenience sake and can be interchanged without any problem.

In the operation of writing data of a SET state, the memory 100 writes a SET state to desired selected memory cells MC among memory cells MC connected to a selected word line WL. That is, the row decoder RD selectively drives a certain word line WL from the word lines WL. The column decoder CD applies the SET voltage Vset to bit lines BL (selected bit lines) connected to the desired memory cells MC to which a SET state is to be written among a plurality of bit lines BL intersecting with the selected word line WL (S20). The memory 100 can thereby write data to a plurality of memory cells MC (also as "page") connected to the selected word line WL. One page is a unit of memory cells MC (or data) to which writing is performed in one write sequence. That is, in the write sequence, the memory 100 writes data in unit of pages. Although a plurality of memory cells MC connected to one selected word line WL is regarded as one page in the first embodiment, one block of memory cells MC connected to a plurality of word lines WL can alternatively be regarded as one page.

It is assumed, for example, that (½)Vset is applied to word lines WL in an unselected state and bit lines BL in an unselected state. The row decoder RD lowers a selected word line WL to a low-level voltage Vss (a ground voltage, for example). The column decoder CD applies the SET voltage Vset to selected bit lines BL connected to memory cells MC to which a SET state is to be written. The SET voltage Vset is thereby applied to the selected memory cells MC connected between the selected word line WL and the selected bit lines BL. Accordingly, a cell current Icell flows in the selected memory cells MC and the selected memory cells MC become a SET state.

Meanwhile, memory cells MC connected between the selected word line WL and unselected bit lines BL and memory cells MC connected between unselected word lines WL and the selected bit lines BL are in a state (a half-selected state) where (½)Vset, which is a voltage about a half of the SET voltage Vset, is applied thereto. It is preferable that the SET voltage Vset is low and that a SET time is short so as not to disturb the memory cells MC in such a half-selected state and not to cause a large leak current to flow in the memory cells MC in the half-selected state. When a SET state is intensively written to memory cells MC with a high SET voltage, the cell current Icell in the memory cells MC becomes large. As a result, when the memory cells MC become a half-selected state, the leak current becomes large. Therefore, it is preferable that the SET voltage Vset is as low as possible unless any problem occurs in a read operation.

As described above, the memory 100 according to the first embodiment repeatedly performs the write loops including the write operation and the verify operation while stepping up the SET voltage Vset from a low voltage (S20 to NO at S40). When the selected memory cells MC to which a SET state has been written pass the verity operation, the voltage of the bit lines BL connected to the memory cells MC is fixed to (½)Vset in the subsequent write loops. When a SET state has been written to selected memory cells MC equal to or more than a predetermined value (YES at S40), the write sequence of that page ends. By thus writing data in plural write loops while stepping up the SET voltage from a low voltage, a SET state can be reliably written to selected memory cells MC and application of the SET voltage Vset higher than necessary to the memory cells MC can be suppressed. In this way, disturbance to half-selected memory cells MC or a leak current in half-selected memory cells MC can be suppressed.

Figure 3:
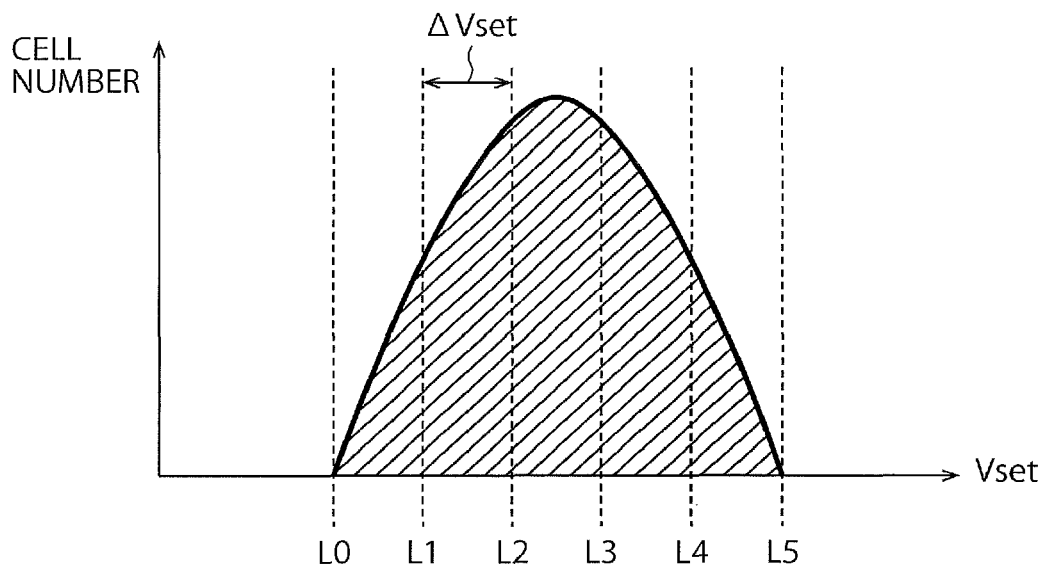
FIG. 3 is a graph showing the number of selected memory cells MC that pass verification with respect to the SET voltage Vset.

When the step-up width (voltage increase width) ΔVset of the SET voltage Vset applied to selected bit lines BL is constant, the numbers of selected memory cells MC that pass verification in the respective write loops greatly differ according to the write loops. For example, FIG. 3 is a graph showing the number of selected memory cells MC that pass verification with respect to the SET voltage Vset. The horizontal axis represents the SET voltage Vset and the vertical axis represents the number of selected memory cells MC to which data is written. When the number of memory cells MC is large, the number of selected memory cells MC to which data is written has a normal distribution with respect to the SET voltage Vset as shown in FIG. 3. In FIG. 3, the step-up width ΔVset of the SET voltage Vset is constant. In this case, the numbers (hereinafter, also "pass cell numbers") of selected memory cells MC that pass verification in respective write loops L1 to L5 differ greatly. The pass cell numbers in the respective write loops correspond to the areas of shaded portions within the respective step-up widths. For example, the area of a shaded portion from L0 to L1 indicates a pass cell number in the loop L1. The area of a shaded portion from L1 to L2 indicates a pass cell number in the loop L2. Similarly, the areas of shaded portions from L2 to L3, L3 to L4, and L4 to L5 indicate pass cell numbers in the loops L3, L4, and L5, respectively. Since a write sequence is started from the loop L1, the write loop is not executed in the L0.

In the example shown in FIG. 3, the pass cell numbers in the write loops L1 and L5 are the smallest. The pass cell numbers in the write loops L2 and L4 are larger than those in the write loops L1 and L5. The pass cell number in the write loop L3 is the largest. Accordingly, in the case where the step-up width ΔVset is constant in this way, the pass cell number in an initial write loop is small and then the pass cell number gradually increases when the write loops are repeated. When the write loops are further repeated, the pass cell number gradually decreases.

When memory cells MC change from a RESET state (a high-resistance state) to a SET state (a low-resistance state), a large cell current Icell flows therein. Therefore, similarly to the pass cell number, a current (the sum of the cell currents) flowing in selected bit lines BL or a selected word line WL is low in an initial write loop and then gradually increases when the write loops are repeated. When the write loops are further repeated, the current flowing in the selected bit lines BL or the selected word line WL gradually decreases. A consumption current Icc of the memory 100 greatly depends on the current flowing in the selected bit lines BL or the selected word line WL. Therefore, in the case where the step-up width ΔVset is constant, the consumption current Icc in a data write operation greatly differs according to the write loops. The consumption current Icc is large in the write loop L3 while being relatively small in the write loops L1 and L5.

Figure 4:
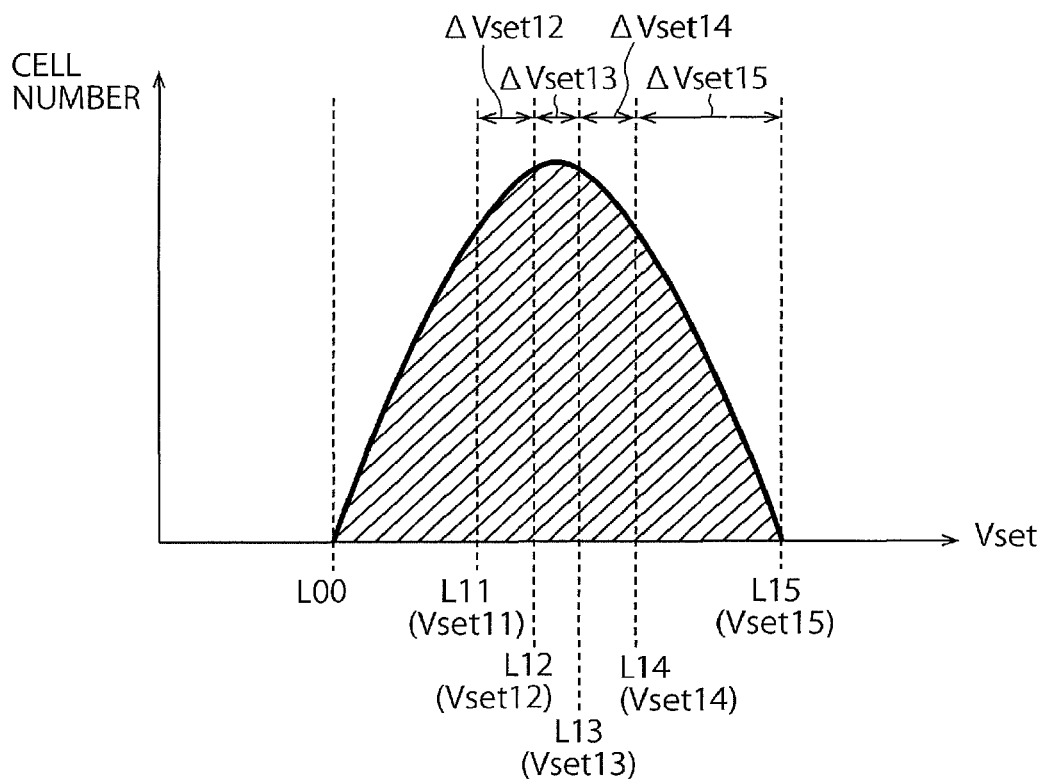
FIG. 4 is a graph showing the number of selected memory cells MC that have passed verification with respect to the SET voltage Vset according to the first embodiment.

To suppress such variation of the consumption current Icc among the write loops, the memory 100 according to the first embodiment causes the step-up widths ΔVset to be different according to the write loops. FIG. 4 is a graph showing the number of selected memory cells MC that have passed verification with respect to the SET voltage Vset according to the first embodiment. The horizontal axis represents the SET voltage Vset and the vertical axis represents the pass cell number. For example, the area of a shaded portion from L00 to L11 indicates a pass cell number in a loop L11. The area of a shaded portion from L11 to L12 indicates a pass cell number in a loop L12. Similarly, the areas of shaded portions from L12 to L13, L13 to L14, and L14 to L15 indicate pass cell numbers in loops L13, L14, and L15, respectively. Since a write sequence is started from the loop L11, the write loop is not executed in the L00.

In FIG. 4, the step-up width ΔVset of the SET voltage Vset is wide in the initial write loop L11 and gradually narrows in the subsequent write loops L12 to L13. In the following write loops L14 and L15, the step-up width ΔVset gradually widens again.

For example, the column decoder CD applies a SET voltage Vset11 as a first voltage to selected bit lines BLs in the first write loop L11. In the second write loop L12 following the first write loop L11, the column decoder CD applies a SET voltage Vset12 as a second voltage higher than the SET voltage Vset11 to the selected bit lines BLs. In the third write loop L13 following the second write loop L12, the column decoder CD applies a SET voltage Vset13 as a third voltage higher than the SET voltage Vset12 to the selected bit lines BLs. Furthermore, the column decoder CD applies a SET voltage Vset14 as a fourth voltage higher than the SET voltage Vset13 to the selected bit lines BLs in the fourth write loop L14 performed after the third write loop L13. In the fifth write loop L15 following the fourth write loop L14, the column decoder CD applies a SET voltage Vset15 as a fifth voltage higher than the SET voltage Vset14 to the selected bit lines BLs.

In this case, a step-up width ΔVset12 (ΔVset12=Vset12−Vset11) of the SET voltage Vset applied to the selected bit lines BLs when the process transitions from the first write loop L11 to the following second write loop L12 is larger than a step-up width ΔVset13 (ΔVset13=Vset13−Vset12) when the process transitions from the second write loop L12 to the following third write loop L13. On the other hand, the step-up width ΔVset13 is smaller than a step-up width ΔVset14 (ΔVset14=Vset14−Vset13) when the process transitions from the third write loop L13 to the following fourth write loop L14. The step-up width ΔVset14 is smaller than a step-up width ΔVset15 (ΔVset15=Vset15−Vset14) when the process transitions from the fourth write loop L14 to the fifth write loop L15 following the fourth write loop L14. As described above, the step-up widths ΔVset12 to ΔVset15 of the SET voltage Vset in the respective write loops L11 to L15 decrease once and then increase in the order of execution of the write loops L11 to L15. In other words, the SET voltage Vset is stepped up relatively widely in initial and terminal write loops in one write sequence and the SET voltage Vset is stepped up relatively narrowly in intermediate write loops between the initial and terminal write loops.

This reduces variation of the pass cell numbers among the write loops L11 to L15. Therefore, variation of the currents (the sum of the cell currents) flowing in the selected bit lines BL or the selected word line WL and variation of the consumption currents Icc among the write loops L11 to L15 can be suppressed to be small as well as the pass cell number.

To realize such an operation, the memory 100 according to the first embodiment sets the SET voltage Vset and/or the step-up width ΔVset for each of the write loops and stores the SET voltage Vset and/or the step-up width ΔVset in the register REG1. The step-up width ΔVset of the SET voltage Vset may differ depending on the product type, the manufacturing line, and the like and thus is set based on statistics, actual measurements, or the like to suppress variation of the pass cell numbers and variation of the consumption current among the respective write loops.

For example, the step-up width ΔVset can be set to divide (disperse) the pass cell number to be almost equal in the respective write loops. Alternatively, the step-up width ΔVset can be set to cause the consumption current Icc of the memory 100 to be almost uniform in the respective write loops. The consumption current Icc is an entire consumption current of the memory 100 and includes a total cell current Icell_t.

Accordingly, variation of the pass cell number and variation of the consumption currents Icc among the respective write loops can be suppressed (the consumption current Icc can be smoothed) and the peak (the maximum value) of the current flowing in the memory cells MC can be lowered.

Second Embodiment

Figure 5:
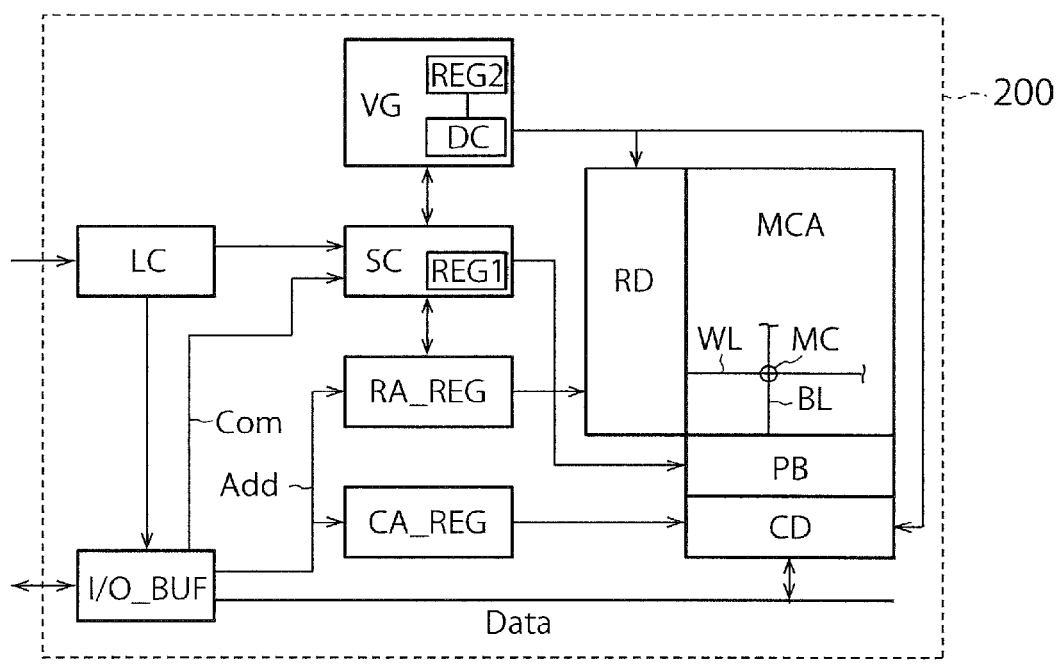
FIG. 5 is a block diagram showing an example of a configuration of a memory 200 according to a second embodiment.

FIG. 5 is a block diagram showing an example of a configuration of a memory 200 according to a second embodiment. In the second embodiment, the memory 200 further includes a register REG2 and a current detector DC in the internal-voltage generation circuit VG. The current detector DC can alternatively be provided outside the internal-voltage generation circuit VG. Other configurations of the second embodiment can be identical to corresponding ones of the first embodiment.

The current detector DC detects a current flowing in a selected word line WL or selected bit lines BL in a write operation in write loops and stops power supply from the column driver CD when the detected current becomes equal to or higher than a predetermined value. The predetermined value of the current is stored in the register REG2 in advance.

Figure 6:
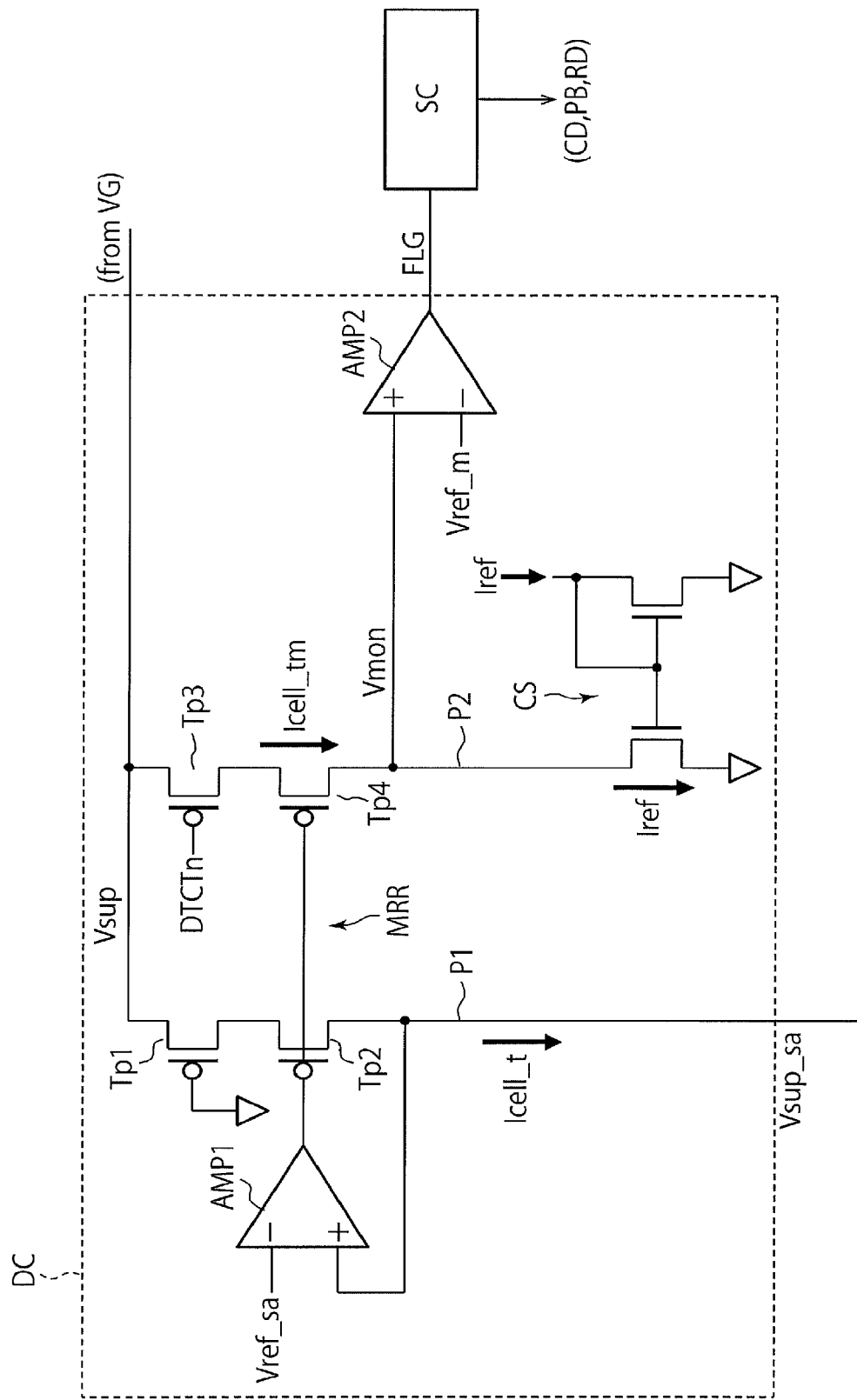
FIG. 6 is a circuit diagram showing an example of an internal configuration of the current detector DC.

FIG. 6 is a circuit diagram showing an example of an internal configuration of the current detector DC. The current detector DC detects whether a current (hereinafter, also "total cell current Icell_t") flowing in a selected word line WL or selected bit lines BL in a write operation in write loops L11 to L15 has become equal to or higher than a first current value Ith1. When the total cell current Icell_t has become equal to or higher than the first current value Ith1, the current detector DC stops power supply from the column driver CD.

The current detector DC includes operational amplifiers AMP1 and AMP2, P-transistors Tp1 to Tp4, and a constant current source CS.

The transistors Tp1 and Tp2 are connected in series to a current path P1. The transistors Tp3 and Tp4 are connected in series to a current path P2.

One end of the current path P1 is connected to a voltage supply Vsup of a voltage generated by the internal-voltage generation circuit VG. The other end of the current path P1 is connected to the bit lines BL via the column decoder CD and the page buffer PB. The sum (the total cell current Icell_t) of the cell currents flowing in selected memory cells MC in the respective write loops thereby flow through the current path P1. One end of the current path P2 is also connected to the voltage supply Vsup. The other end of the current path P2 is connected to, for example, a low-level voltage Vss via the constant current source CS.

Gate electrodes of the transistors Tp2 and Tp4 are connected in common to an output of the operational amplifier AMP1 and constitute a mirror circuit MRR. The mirror circuit MRR causes a mirror current Icell_tm proportional to the total cell current Icell_t that flows through the current path P1 to flow through the current path P2.

A gate electrode of the transistor Tp3 is connected to a detection start signal DTCTn. The transistor Tp3 thereby functions as a switching element that becomes a conductive state when detecting a current flowing in selected memory cells MC in the write loops.

An inverting input of the operational amplifier AMP1 is connected to a reference voltage Vref_sa and a non-inverting input thereof is connected to the current path P1. The output of the operational amplifier AMP1 is connected to the gate electrodes of the transistors Tp2 and Tp4 in common. The operational amplifier AMP1 thereby causes a voltage Vsup_sa of the current path P1 to be almost equal to the reference voltage Vref_sa.

The constant current source CS limits the current flowing through the current path P2 to a reference current Iref. Therefore, when the mirror current Icell_tm is lower than the reference current Iref, the current path P2 allows a current amount according to the mirror current Icell_tm to flow. In this case, a monitor voltage Vmon is lower than a reference voltage Vref_m. On the other hand, when the mirror current Icell_tm becomes equal to or higher than the reference current Iref, the current path P2 allows a current amount according to the reference current Iref to flow. In this case, the monitor voltage Vmon becomes equal to or higher than the reference voltage Vref_m.

An inverting input of the operational amplifier AMP2 is connected to the reference voltage Vref_m and a non-inverting input thereof is connected to the current path P2 to input the voltage of the current path P2 as the monitor voltage Vmon. The operational amplifier AMP2 outputs a comparison result between the monitor voltage Vmon and the reference voltage Vref_m to the sequence controller SC as a flag signal FLG.

With this configuration, the current detector DC supplies the total cell current Icell_t to selected bit lines BL, selected memory cells MC, and a selected word line WL via the column decoder CD and the page buffer PB (the sense amplifier) and detects the current value thereof in the respective write loops. The total cell current Icell_t flowing through the current path P1 is monitored as the mirror current Icell_tm flowing through the current path P2. Because the mirror current Icell_tm is proportional to the total cell current Icell_t, the total cell current Icell_t can also be monitored by monitoring the mirror current Icell_tm. For example, when the total cell current Icell_t is lower than a predetermined value (the first current value), the mirror current Icell_tm is lower than the reference current Iref and the monitor voltage Vmon is lower than the reference voltage Vref_m. Therefore, the flag signal FLG is deactivated to logic low. On the other hand, when the total cell current Icell_t becomes equal to or higher than the predetermined value (the first current value), the mirror current Icell_tm becomes equal to or higher than the reference current Iref and the monitor voltage Vmon becomes equal to or higher than the reference voltage Vref_m. Therefore, the flag signal FLG is activated to logic high. When the flag signal FLG is activated to logic high, the write operation in the write loops is stopped. In this way, the current detector DC can stop a power supply operation of the column driver CD and the row decoder RD when the total cell current Icell_t flowing in selected bit lines BL or a selected word line WL becomes equal to or higher than the first current value.

The predetermined value (the first current value) of the total cell current Icell_t can be changed by adjustment of the reference current Iref. That is, through appropriate setting of the reference current Iref, the current detector DC can set the predetermined value (the first current value) of the total cell current Icell_t.

The sequence controller SC activates a reset signal RSTn when the flag signal FLG is activated to logic high. The reset signal RSTn is output to the column decoder CD and the row decoder RD. In response to activation of the reset signal RSTn, the column decoder CD and the row decoder RD stop the write operation in the relevant write loop. That is, in response to activation of the reset signal RSTn, the column decoder CD stops application of the SET voltage Vset to selected bit lines BL. In response to activation of the reset signal RSTn, the row decoder RD stops voltage application to a selected word line WL. Respective values of the reference voltages Vref_m and Vref_sa and the reference current Iref can be stored in advance in the register REG2.

Figure 7:
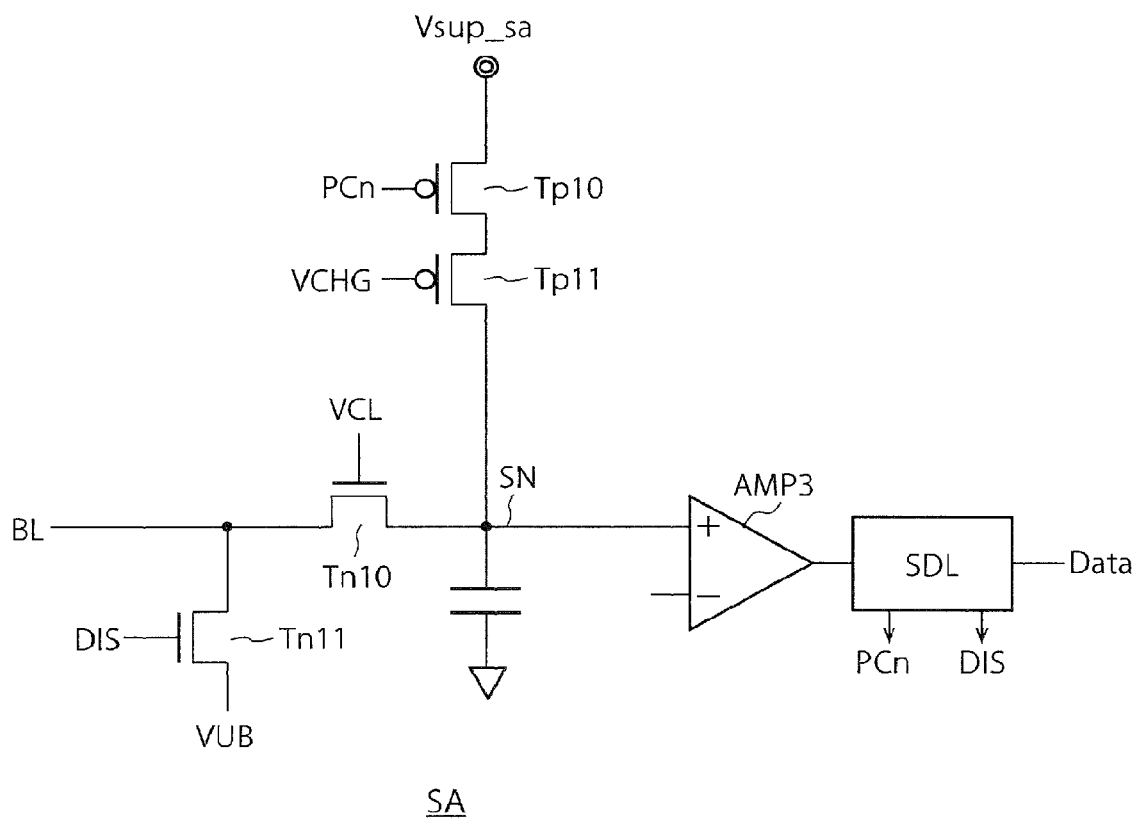
FIG. 7 is a circuit diagram showing an example of an internal configuration of a sense amplifier circuit SA.

FIG. 7 is a circuit diagram showing an example of an internal configuration of a sense amplifier circuit SA. The sense amplifier circuit SA is incorporated in the page buffer PB and detects data stored in memory cells MC via bit lines BL in a data read operation. In a data write operation, the sense amplifier circuit SA supplies power to the memory cells MC via the bit lines BL.

The sense amplifier circuit SA includes P-transistors Tp10 and Tp11, N-transistors Tn10 and Tn11, a latch circuit SDL, and an operational amplifier AMP3. Because the operational amplifier AMP3 is not used in a data write operation while being used in a data read operation, explanations thereof are omitted herein.

The transistors Tp10 and Tp11 are connected in series between the current detector DC in FIG. 6 and a sense node SN. The transistors Tp10 and Tp11 receive the voltage Vsup_sa (Vsup_sa=Vref_sa) generated by the current detector DC and supply power to the sense node SN. A gate electrode of the transistor Tp10 is connected to the latch circuit SDL and receives a selection signal PCn. The transistor Tp10 becomes a conductive state or a non-conductive state according to logic of the selection signal PCn. The selection signal PCn will be explained later. The transistor Tp11 receives a voltage VCHG at a gate electrode thereof and defines an upper limit of the cell current. The transistor Tp11 thereby suppresses the cell current from becoming excessively high.

The transistor Tn10 is connected between the sense node SN and the bit lines BL and converts the voltage Vsup_sa to the SET voltage Vset to apply the SET voltage Vset to the bit lines BL. At that time, the SET voltage Vset is the sum (VCL+Vth) of a clamp voltage VCL applied to a gate electrode of the transistor Tn10 and a threshold voltage Vth of the transistor Tn10. As described above, the SET voltage Vset is stepped up each time the write loop is performed. Therefore, change of the SET voltage Vset is achieved by changing the clamp voltage VCL. The step-up widths ΔVset12 to ΔVset15 can be stored in advance in the register REG1 in the sequence controller SC.

The transistor Tn11 is connected between the bit lines BL and an unselection voltage source VUB. The voltage of the unselection voltage source VUB is applied to unselected bit lines or bit lines (already-written bit lines) connected to memory cells MC to which a SET state is already written, thereby bringing these bit lines BL to an unselected state. For example, the voltage of the unselection voltage source VUB is (½)Vset. A gate electrode of the transistor Tn11 is connected to the latch circuit SDL and receives an unselection signal DIS. The transistor Tn11 becomes a conductive state or a non-conductive state according to logic of the unselection signal DIS.

The latch circuit SDL latches write data and outputs the selection signal PCn and the unselection signal DIS according to logic of the write data. For example, assuming that a RESET state is data "0" and a SET state is data "1", the latch circuit SDL brings the selection signal PCn to a deactivated state (logic high, for example) and the unselection signal DIS to an activated state (logic high, for example) when the write data is "0". Because the transistor Tp10 that receives the selection signal PCn is a P type in this example, the deactivated state of the selection signal PCn is logic high. The latch circuit SDL corresponding to an already-written bit line sets the selection signal PCn to a deactivated state (logic high, for example) and the unselection signal DIS to an activated state (logic high, for example) similarly to the case where the write data is "0". On the other hand, when the write data is "1", the latch circuit SDL brings the selection signal PCn to an activated state (logic low, for example) and the unselection signal DIS to a deactivated state (logic low, for example).

Accordingly, when the write data is "0" or the relevant memory cell MC has passed verification, a bit line BL corresponding to the relevant column is connected to the unselection voltage source VUB and becomes an unselected state. For example, the bit line BL is kept at (½)Vset.

When the write data is "1" and the relevant memory cell MC has not yet passed verification, a bit line BL corresponding to the relevant column receives the voltage Vsup_sa via the transistors Tp10, Tp11, and Tn10. The SET voltage Vset is thereby applied to the bit line BL and a current is supplied thereto.

Figure 8:
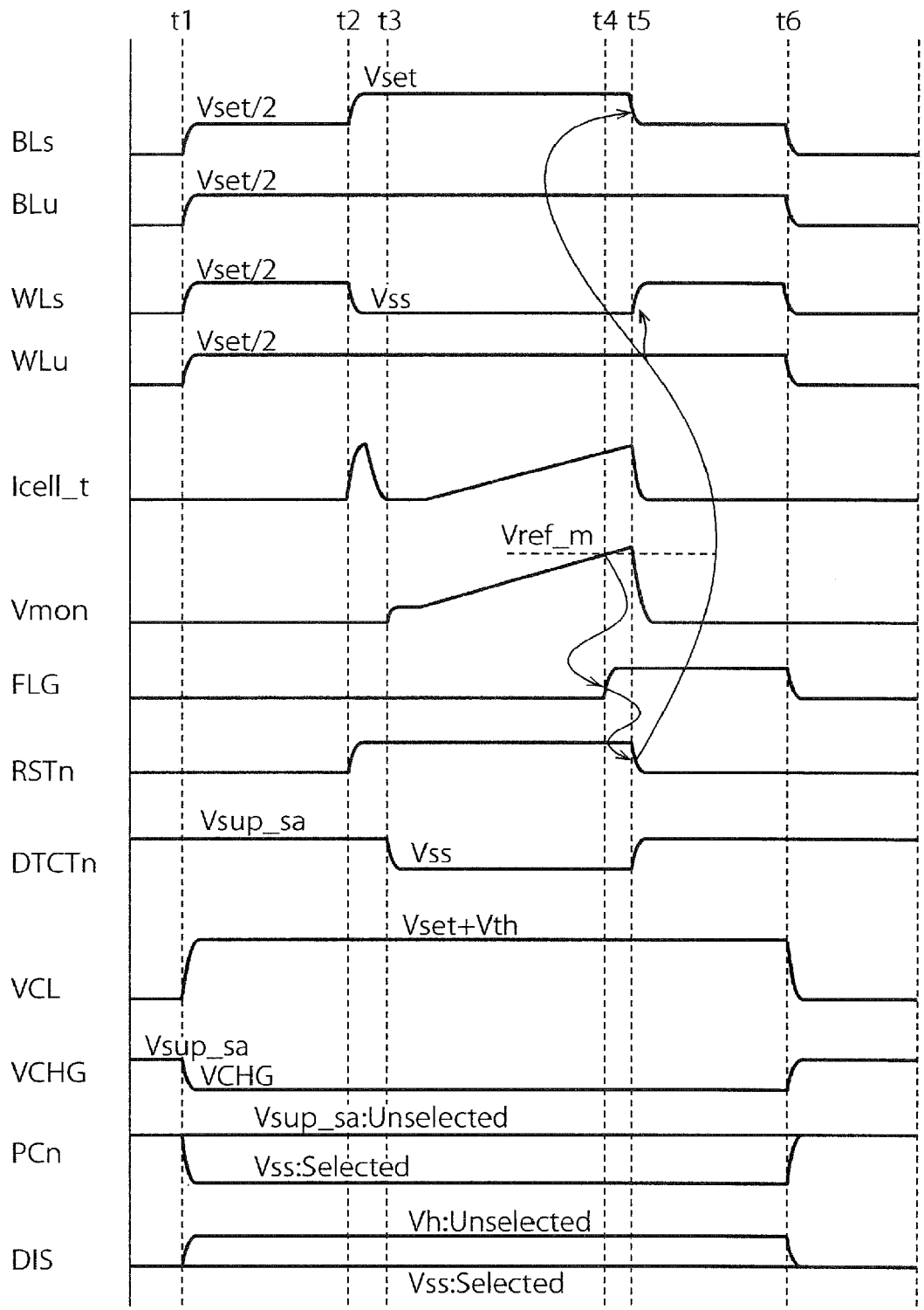
FIG. 8 is a timing chart showing an example of an operation in a write loop of the memory 200 according to the second embodiment.

FIG. 8 is a timing chart showing an example of an operation in a write loop of the memory 200 according to the second embodiment.

First, at a time t1, a write loop is started. At the time t1, (½)Vset is applied to bit lines BLs and BLu and word lines WLs and WLu, respectively. The bit lines BLs indicate selected bit lines and the bit lines BLu indicate unselected bit lines. The word line WLs indicates a selected word line and the word lines WLu indicate unselected word lines. The clamp voltage VCL rises to enable the SET voltage Vset to be applied to the selected bit lines BLs.

The selected bit lines BLs are connected to the unselection voltage source VUB via the transistor Tn11 in FIG. 7. This enables (½)Vset to be applied to the selected bit lines BLs.

The voltage VCHG becomes a low-level voltage and the transistor Tp11 in FIG. 7 becomes a conductive state. The selection signal PCn of columns corresponding to the selected bit lines BLs is set at the low-level voltage Vss. The unselection signal DIS of the columns corresponding to the selected bit lines BLs is kept at the low-level voltage Vss. The selection signal PCn of columns corresponding to the unselected bit lines BLu is kept at the high-level voltage Vsup_sa. The unselection signal DIS of the columns corresponding to the unselected bit lines BLu is set at a high-level voltage Vh.

Next, at a time t2, the selected bit lines BLs are set at the SET voltage Vset and the selected word line WLs is set at the low-level voltage Vss. At that time, to further charge the selected bit lines BLs, the total cell current Icell_t temporarily rises. The reset signal RSTn rises and the column decoder CD and the row decoder RD are enabled to operate effectively.

Subsequently, at a time t3, the detection start signal DTCTn falls from the high-level voltage Vsup_sa to the low-level voltage Vss, thereby bringing the transistor Tp3 in FIG. 6 to a conductive state. Detection of the total cell current Icell_t using the current path P2 is thereby started. Therefore, the monitor voltage Vmon increases with increase of the total cell current Icell_t.

Next, when the monitor voltage Vmon becomes equal to or higher than the reference voltage Vref_m at a time t4, the flag signal FLG is activated to logic high as explained with reference to FIG. 6. Accordingly, at a time t5, the reset signal RSTn falls and the detection start signal DTCTn returns to the voltage Vsup_sa. Further, the column decoder CD causes the voltage of the selected bit lines BLs to fall to (½)Vset and the row decoder RD causes the voltage of the selected word line WLs to rise to (½)Vset. The write operation of data and the detection operation of the total cell current Icell_t thereby end.

Subsequently, at a time t6, the bit lines BLs and BLu and the word lines WLs and WLu fall from (½)Vset. At that time, the flag signal FLG and the clamp voltage VCL are reset to logic low. The selection signal PCn of the columns corresponding to the selected bit lines BLs returns to the high-level voltage Vsup_sa. The unselection signal DIS of the columns corresponding to the unselected bit lines BLu returns to the low-level voltage Vss. The write loop thereby ends.

The memory 200 performs this write loop repeatedly. At that time, each time the write loop is repeated, the clamp voltage VCL is stepped up to increase the SET voltage Vset of selected bit lines BL.

In the second embodiment, when the current flowing in selected bit lines BL in a write operation in the respective write loops becomes equal to or higher than the first current value, the current detector DC stops the power supply operation of the column decoder CD. Accordingly, the maximum value of the total cell current Icell_t in the respective write loops is suppressed to be lower than the first current value and variation of the consumption currents Icc of the memory 200 is suppressed.

In the second embodiment, the step-up widths in the write loops can be set to be almost equal as explained with reference to FIG. 3 or can be different as explained with reference to FIG. 4.

For example, when the step-up width is constant, the memory 200 is controlled based on the total cell current Icell_t in the respective write loops detected by the current detector DC. Because the total cell current Icell_t depends on the pass cell number, the pass cell number is also limited substantially to a predetermined number by limiting the total cell current Icell_t to be lower than the first current value. Therefore, also when the current detector DC limits the total cell current Icell_t, variation of the pass cell number and variation of the consumption currents in the respective write loops can be suppressed regardless of the step-up width of the SET voltage Vset.

Alternatively, the step-up width can be set to be different according to the write loops. In this case, because the step-up width of the SET voltage Vset may differ depending on the product type, the manufacturing line, and the like as described above, the step-up width is set based on statistics, actual measurements, or the like to suppress variation of the pass cell numbers and variation of the consumption currents in the respective write loops. The SET voltages Vset or the step-up widths (ΔVset12 to ΔVset15, for example) set in this way can be stored in advance in the register REG1 serving as a storage part. According to the second embodiment, the step-up width (the voltage increase width) of the voltage of selected bit lines BL is set to decrease once and then increase in the order of execution of the write loops. Furthermore, the current detector DC limits the total cell current Icell_t to be lower than the first current value. Accordingly, variation of the pass cell numbers and variation of the consumption currents in the respective write loops can be suppressed (the pass cell number and the consumption current can be smoothed), thereby lowering the peak (the maximum value) of the current flowing in the memory cells.

When different step-up widths are to be set, the step-up widths can be set to divide (disperse) the pass cell number to be almost equal in the respective write loops. Alternatively, the step-up widths can be set to cause the total cell current Icell_t to be almost uniform in the respective write loops.

Effects of the memories 100 and 200 according to the first and second embodiments are explained next.

Figure 9A:
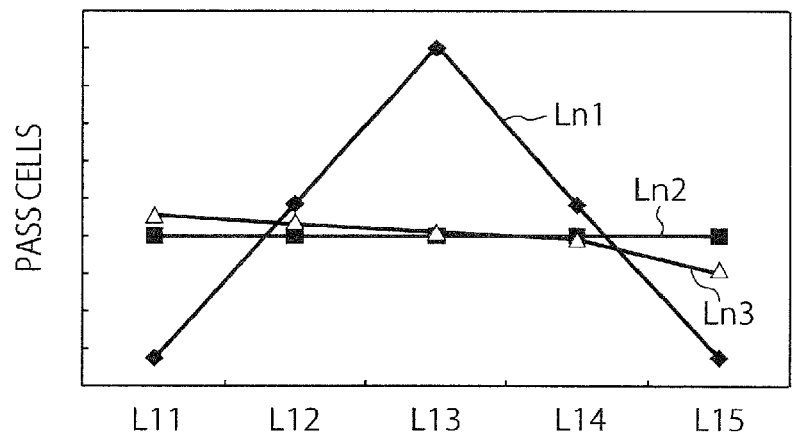
FIG. 9A is a graph showing a relation between a plurality of write loops and a pass cell number.
Figure 9B:
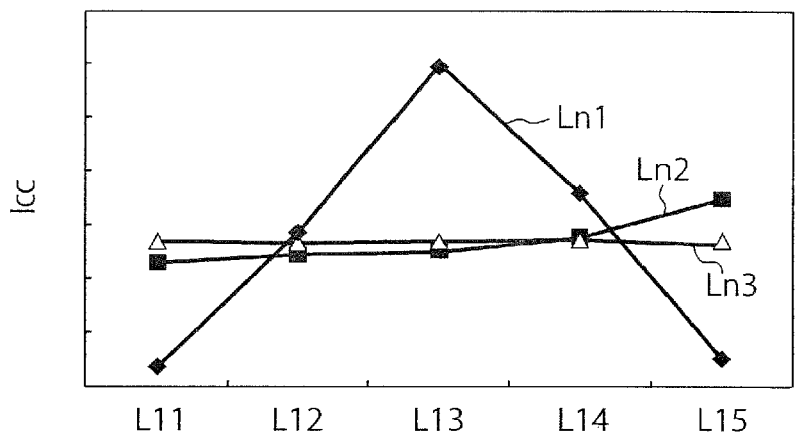
FIG. 9B is a graph showing a relation between a plurality of write loops and a consumption current Icc of the memory 100.

FIG. 9A is a graph showing a relation between a plurality of write loops and a pass cell number. FIG. 9B is a graph showing a relation between a plurality of write loops and a consumption current Icc of the memory 100 or 200. The horizontal axis represents the write loops. The vertical axis of FIG. 9A represents the pass cell number and the vertical axis of FIG. 9B represents the consumption current Icc. Because these graphs show the effects, write loops L11 to L15 do not necessarily match the write loops L11 to L15 in FIG. 4.

A line Ln1 indicates the pass cell number in a case where the step-up width of the SET voltage Vset is constant. A line Ln2 indicates the pass cell number in a case where the step-up width of the SET voltage Vset is set in such a manner that the pass cell number becomes constant. A line Ln3 indicates the pass cell number in a case where the step-up width of the SET voltage Vset is set in such a manner that the consumption current Icc becomes constant.

Because the step-up width is constant in the line Ln1 in FIG. 9A, the pass cell number is small in the initial write loop L11 and then the pass cell number gradually increases when the write loops (L12 and L13) are repeated as explained with reference to FIG. 3. When the write loops (L14 and L15) are further repeated, the pass cell number gradually decreases. In this case, variation of the pass cell numbers in the respective write loops L11 to L15 is large. As indicated by a line Ln1 in FIG. 9B, the consumption current Icc is small in the initial write loop L11 and then the consumption current Icc gradually increases when the write loops (L12 and L13) are repeated similarly to the tendency of the pass cell number. When the write loops (L14 and L15) are further repeated, the consumption current Icc gradually decreases. In this case, variation of the consumption currents Icc in respective the write loops L11 to L15 is also large.

On the other hand, in the line Ln2 in FIG. 9A, the pass cell number is constant in the write loops L11 to L15. Therefore, in the line Ln2, the pass cell number is divided (dispersed) to be almost equal in the write loops L11 to L15. On the other hand, as indicated by a line Ln2 in FIG. 9B, the consumption current Icc somewhat varies in the write loops L11 to L15. This is because, when the SET voltage Vset becomes high, current efficiency (output current of step-up circuit/consumption current of step-up circuit) of the internal-voltage generation circuit VG decreases, which increases the consumption current Icc even if the pass cell number is constant. Therefore, in the line Ln2, the consumption current Icc increases with increase in the SET voltage Vset. That is, when the pass cell number is constant, variation of the pass cell numbers and variation of the consumption currents Icc can be reduced more than in the case where the step-up width is constant. However, variation of the consumption currents Icc still remains.

In a line Ln3 in FIG. 9B, the consumption current Icc is constant in the write loops L11 to L15. Therefore, in the line Ln3, the consumption current Icc is almost uniform in the write loops L11 to L15. On the other hand, as indicated by the line Ln3 in FIG. 9A, the pass cell number somewhat varies in the write loops L11 to L15. This is because the current efficiency of the internal-voltage generation circuit VG decreases when the SET voltage Vset becomes high. When the current efficiency decreases, the current amount that is enabled to flow as the total cell current Icell_t with respect to the consumption current Icc decreases. That is, when the consumption current Icc is constant, the total cell current Icell_t decreases and the pass cell number decreases. Therefore, in the line Ln3, the pass cell number decreases with increase in the SET voltage Vset. That is, when the consumption current Icc is constant, variation of the pass cell numbers and variation of the consumption currents Icc can be reduced more than in the case where the step-up width is constant. However, variation of the pass cell numbers still remains.

In this manner, in either case of setting the step-up width to cause the pass cell number to be constant or setting the step-up width to cause the consumption current Icc to be constant, the memory 100 or 200 can achieve the effects of the second embodiment. Whether to set the step-up width to cause the pass cell number to be constant or to cause the consumption current Icc to be constant can be arbitrarily selected. For example, the step-up width can be set to cause the pass cell number to be constant considering ease of setting the SET voltage Vset or the step-up width. Alternatively, the step-up width can be set to cause the consumption current Icc to be constant placing importance to smoothing of the consumption current Icc.

Of course, as described above, the total cell current Icell_t in the respective write loops can be set to be constant through provision of the current detector DC. Control on the total cell current Icell_t by the current detector DC can be combined with either equalization of the pass cell number or smoothing of the consumption current Icc described above.

Figure 9C:
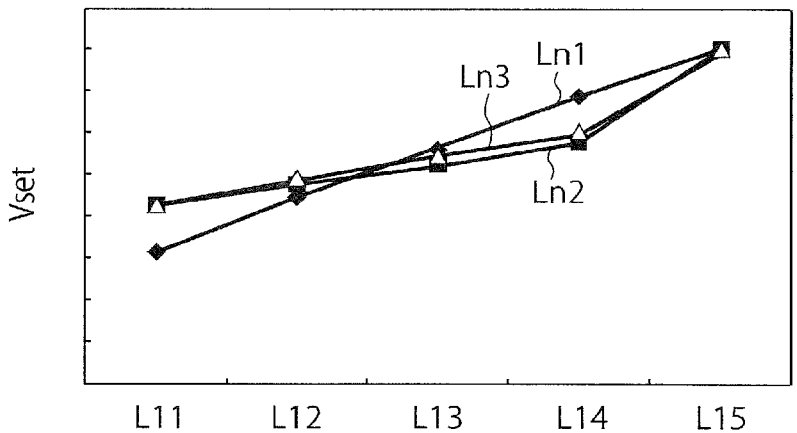
FIG. 9C is a graph showing a relation between the write loops and the SET voltage Vset of the memory 100.

FIG. 9C is a graph showing a relation between the write loops and the SET voltage Vset of the memory 100 or 200. The vertical axis of FIG. 9C represents the SET voltage Vset. Referring to FIG. 9C, the SET voltage Vset indicated by a line Ln1 is linear, which indicates that the SET voltage Vset increases at a constant step-up width in the write loops L11 to L15. On the other hand, it can be seen that the SET voltages Vset indicated by lines Ln2 and Ln3 increase at different step-up widths in the write loops L11 to L15. The SET voltages Vset and/or the step-up widths can be stored in advance in the register REG1.

(First Modification)

Figure 10:
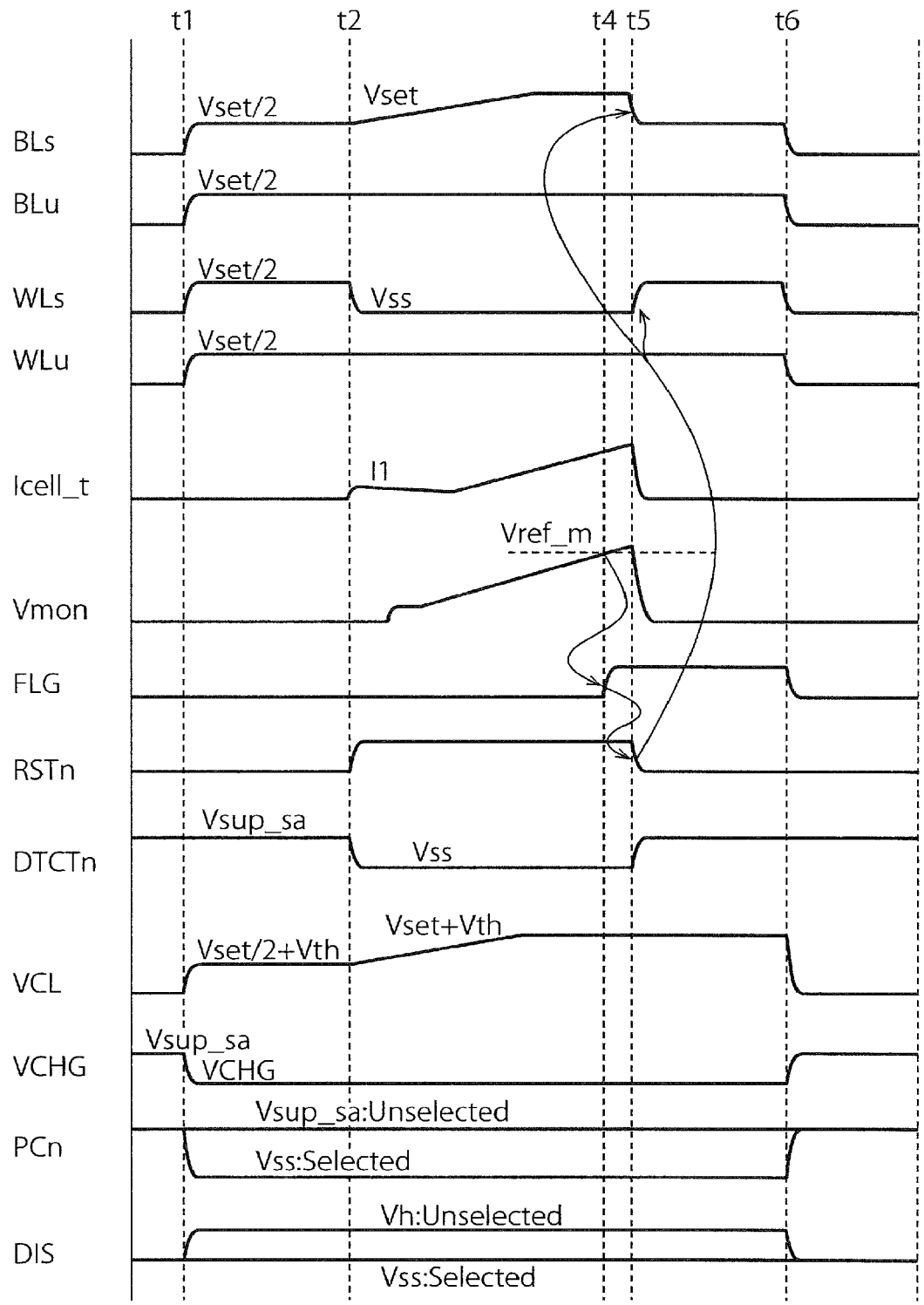
FIG. 10 is a timing chart showing an example of write loops according to a first modification of the first or second embodiment.

FIG. 10 is a timing chart showing an example of write loops according to a first modification of the first or second embodiment. The configuration of the memory 100, 200 according to the first modification can be identical to that according to the first and second embodiments.

In the embodiments described above, detection of the total cell current Icell_t by the current detector DC is started after the time t3 when the voltage of selected bit lines BLs has been stabilized at the SET voltage Vset as shown in FIG. 8. This is because if detection of the total cell current Icell_t is started before the voltage of selected bit lines BLs is stabilized, a charge current for the bit lines BL appear as the total cell current Icell_t, which prevents the current detector DC from accurately detecting the total cell current Icell_t. Therefore, in the above embodiments, the current detector DC is started after the voltage of selected bit lines BLs has been stabilized at the SET voltage Vset.

On the other hand, in the first modification, the column decoder CD charges selected bit lines BLs while limiting a current to the selected bit lines BLs. This enables the current detector DC to start detection of the total cell current Icell_t at the time t2 when the SET voltage Vset is applied to the selected bit lines BLs. Accordingly, periods of the respective write loops can be shortened.

For example, in FIG. 10, the total cell current Icell_t is limited to a predetermined value I1. The clamp voltage VCL is thereby set at (½)Vset+Vth at a time t1 and then gradually increases to Vset+Vth during times t2 and t4. With this increase, the voltage of selected bit lines BLs also gradually increases from (½)Vset to Vset during times t2 and t4.

The current-detection start signal DTCTn for selected bit lines BLs is activated to the low-level voltage Vss at the time t2 simultaneously with start of charge of the selected bit lines BLs. Therefore, the current detector DC starts a detection operation of the total cell current Icell_t from the time t2. In this way, because the current is limited at the time of charge of selected bit lines BLs in the first modification, the current detector DC can start detection of the total cell current Icell_t from the time t2 when the SET voltage Vset is applied to the selected bit lines BLs. Accordingly, the periods of the respective write loops can be shortened. Other operations of the first modification can be similar to corresponding ones of the first or second embodiment. Therefore, the first modification can attain the effects identical to those of the first or second embodiment.

(Second Modification)

Figure 11:
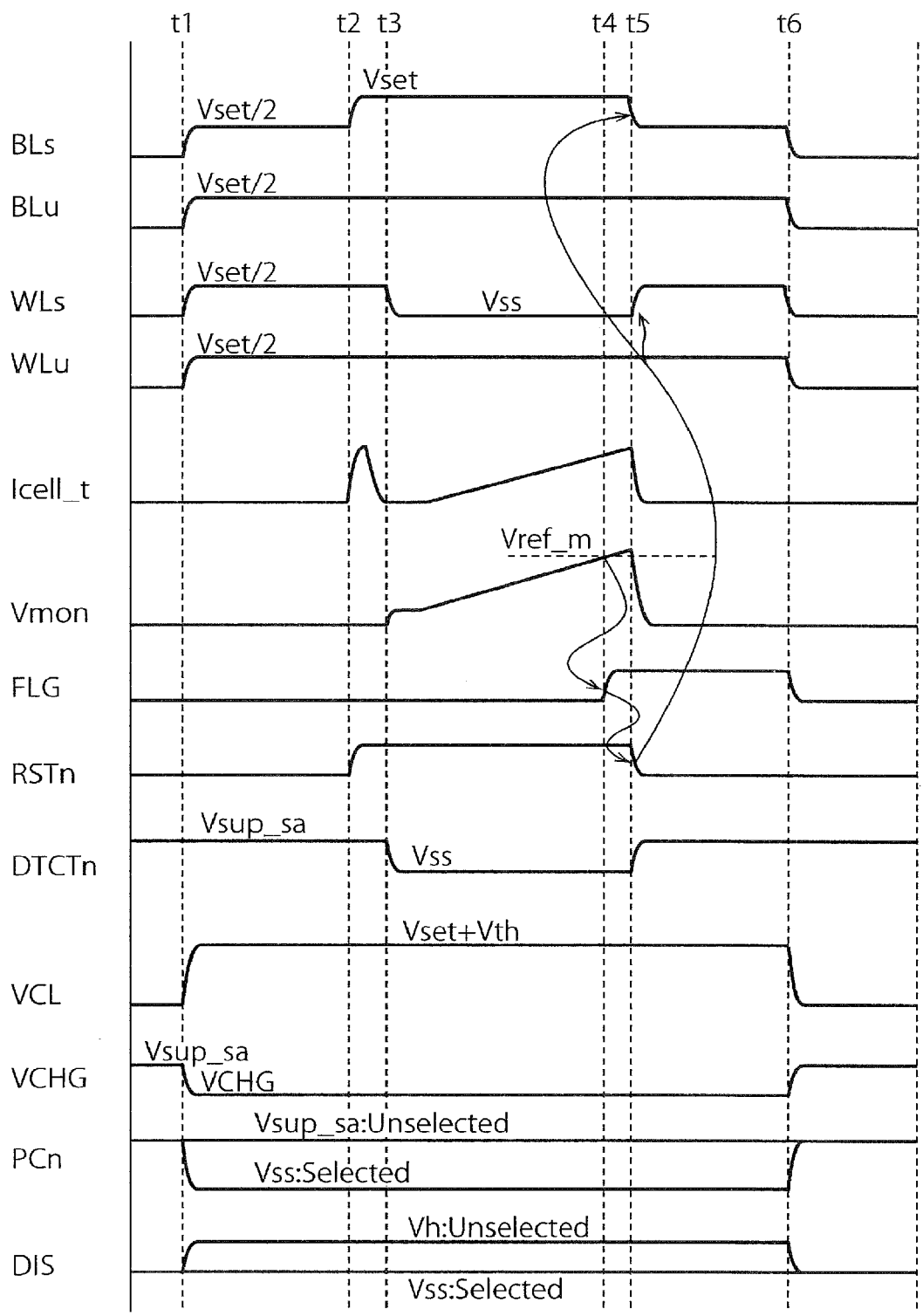
FIG. 11 is a timing chart showing an example of a write loop according to a second modification of the first or second embodiment.

FIG. 11 is a timing chart showing an example of a write loop according to a second modification of the first or second embodiment. The configuration of the memory 100 according to the second modification can be identical to that according to the first and second embodiments.

In the above embodiments, the timing when a selected word line WLs is caused to fall to the low-level voltage Vss is the time t2, which is almost the same as the timing when selected bit lines BLs are caused to rise to the SET voltage Vset. In this case, the charge current and the total cell current Icell_t of the selected bit lines BLs during times t2 and t3 may flow simultaneously at the time t2. If the consumption current Icc is limited to be low in this case, the total cell current Icell_t needs to be lowered. Accordingly, the number of memory cells MC to which a SET state is written in the respective write loops may be reduced and the number of the write loops may be increased. If the number of the write loops is large, the time of the entire write sequence is extended.

On the other hand, in the second modification, the timing when a selected word line WLs is caused to fall to the low-level voltage Vss is shifted to the time t3, which is later than the timing when selected bit lines BLs are caused to rise to the SET voltage Vset. The charge current and the total cell current Icell_t of the selected bit lines BLs can be thereby temporally shifted with each other and thus the total cell current Icell_t (the first current value) can be set to be relatively large. As a result, the number of write loops can be reduced and the time of the entire write sequence can be shortened.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a plurality of first signal lines;
a plurality of second signal lines;
a plurality of resistance-change memory cells being between the first signal lines and the second signal lines, respectively;
a first driver capable of supplying power to the first signal lines; and
a second driver capable of supplying power to the second signal lines, the second driver increasing a voltage of selected one of the second signal lines in a write loop higher than that of the selected second signal line in a previous write loop, the write loop including a write operation of writing data to the memory cells and a verify operation of verifying that data has been written thereto, wherein
a voltage increase width of the selected second signal line at a time of transition from a first write loop to a second write loop following the first write loop in the write loops is larger than a voltage increase width of the selected second signal line at a time of transition from the second write loop to a third write loop following the second write loop in the write loops, and
a voltage increase width of the selected second signal line at a time of transition from the second write loop to the third write loop is smaller than a voltage increase width of the selected second signal line at a time of transition from the third write loop to a fourth write loop following the third write loop in the write loops.

2. The device of claim 1, wherein voltage increase widths of the selected second signal line in the respective write loops decrease once and then increase in order of execution of the write loops.

3. The device of claim 1, further comprising a current detector stopping power supply of the second driver when a current flowing in the first or second signal lines in a write operation of the write loops becomes equal to or higher than a first current value.

4. The device of claim 1, wherein voltage increase widths of the selected second signal line are set to cause numbers of the memory cells to which data has been written in the respective write loops to be almost uniform.

5. The device of claim 1, further comprising a storage part storing, in advance, voltages of the selected second signal line or voltage increase widths of the selected second signal line in the respective write loops.

6. The device of claim 2, further comprising a storage part storing, in advance, voltages of the selected second signal line or voltage increase widths of the selected second signal line in the respective write loops.

7. The device of claim 4, further comprising a storage part storing, in advance, voltages of the selected second signal line or voltage increase widths of the selected second signal line in the respective write loops.

8. A semiconductor storage device comprising:
a plurality of first signal lines;
a plurality of second signal lines;
a plurality of resistance-change memory cells being between the first signal lines and the second signal lines, respectively;
a first driver capable of supplying power to the first signal lines; and
a second driver capable of supplying power to the second signal lines, the second driver increasing a voltage of selected one of the second signal lines in a write loop higher than that of the selected second signal line in a previous write loop, the write loop including a write operation of writing data to the memory cells and a verify operation of verifying that data has been written thereto, wherein
voltage increase widths of the selected second signal line are set to cause consumption currents of the semiconductor storage device in the respective write loops to be almost uniform.

9. The device of claim 8, wherein voltage increase widths of the selected second signal line in the respective write loops decrease once and then increase in order of execution of the write loops.

10. The device of claim 8, further comprising a current detector stopping power supply of the second driver when a current flowing in the first or second signal lines in a write operation of the write loops becomes equal to or higher than a first current value.

11. The device of claim 9, further comprising a current detector stopping power supply of the second driver when a current flowing in the first or second signal lines in a write operation of the write loops becomes equal to or higher than a first current value.

12. The device of claim 8, further comprising a storage part storing, in advance, voltages of the selected second signal line or voltage increase widths of the selected second signal line in the respective write loops.

13. The device of claim 9, further comprising a storage part storing, in advance, voltages of the selected second signal line or voltage increase widths of the selected second signal line in the respective write loops.

14. A semiconductor storage device comprising:
a plurality of first signal lines;
a plurality of second signal lines;
a plurality of resistance-change memory cells being between the first signal lines and the second signal lines, respectively;
a first driver capable of supplying power to the first signal lines; and
a second driver capable of supplying power to the second signal lines, the second driver increasing a voltage of selected one of the second signal lines in a write loop higher than that of the selected second signal line in a previous write loop, the write loop including a write operation of writing data to the memory cells and a verify operation of verifying that data has been written thereto is performed, wherein
a voltage increase width of the selected second signal line is set to cause numbers of the memory cells to which data has been written in the respective write loops to be almost uniform, and
voltage increase widths of the selected second signal line in the respective write loops decrease once and then increase in order of execution of the write loops.

15. The device of claim 14, further comprising a current detector stopping power supply of the second driver when a current flowing in the first or second signal lines in a write operation of the write loops becomes equal to or higher than a first current value.

16. The device of claim 14, further comprising a storage part storing, in advance, voltages of the selected second signal line or voltage increase widths of the selected second signal line in the respective write loops.

17. A driving method of a semiconductor storage device comprising a plurality of first signal lines, a plurality of second signal lines, a plurality of resistance-change memory cells being between the first signal lines and the second signal lines, respectively, a first driver capable of supplying power to the first signal lines, and a second driver capable of supplying power to the second signal lines, the method comprising:

when a plurality of write loops comprising a write operation of writing data to the memory cells and a verify operation of verifying that data has been written thereto are performed, applying a first voltage to selected one of the second signal lines in a first write loop;

applying a second voltage higher than the first voltage to the selected second signal line in a second write loop following the first write loop;

applying a third voltage higher than the second voltage to the selected second signal line in a third write loop following the second write loop;

applying a fourth voltage higher than the third voltage to the selected second signal line in a fourth write loop performed after the third write loop, wherein a voltage increase width from the first voltage to the second voltage is larger than that from the second voltage to the third voltage, and a voltage increase width from the second voltage to the third voltage is smaller than that from the third voltage to the fourth voltage.

\* \* \* \* \*